(12) United States Patent
Bryan et al.

(10) Patent No.: US 11,915,901 B2
(45) Date of Patent: Feb. 27, 2024

(54) METHODS AND SYSTEMS INCLUDING PULSED DUAL-BEAM CHARGE NEUTRALIZATION

(71) Applicant: ULVAC-PHI, INCORPORATED, Kanagawa (JP)

(72) Inventors: Scott R. Bryan, Chanhassen, MN (US); Gregory L. Fisher, Chaska, MN (US); David H. Narum, Orono, MN (US); Ronald E. Negri, Minnetonka, MN (US)

(73) Assignee: ULVAC-PHI, INCORPORATED, Kanagawa (JP)

( * ) Notice: Subject to any disclaimer, the term of this patent is extended or adjusted under 35 U.S.C. 154(b) by 0 days.

(21) Appl. No.: 18/023,545

(22) PCT Filed: Aug. 27, 2021

(86) PCT No.: PCT/US2021/048003
§ 371 (c)(1),
(2) Date: Feb. 27, 2023

(87) PCT Pub. No.: WO2022/047190
PCT Pub. Date: Mar. 3, 2022

(65) Prior Publication Data
US 2023/0245848 A1 Aug. 3, 2023

Related U.S. Application Data

(60) Provisional application No. 63/071,542, filed on Aug. 28, 2020.

(51) Int. Cl.
*H01J 37/02* (2006.01)
*H01J 37/28* (2006.01)

(52) U.S. Cl.
CPC ............ *H01J 37/026* (2013.01); *H01J 37/28* (2013.01); *H01J 2237/0045* (2013.01); *H01J 2237/2527* (2013.01)

(58) Field of Classification Search
CPC .......... H01J 37/00; H01J 37/02; H01J 37/026; H01J 37/26; H01J 37/28; H01J 2237/0045;
(Continued)

(56) References Cited

U.S. PATENT DOCUMENTS 4,249,077 A * 2/1981 Crawford .............. H01J 37/026
250/311
5,990,476 A * 11/1999 Larson ............... G01N 23/2273
250/305

(Continued)

OTHER PUBLICATIONS

"K-Alpha C-ray photoelectron spectrometer (XPS) system Fast, powerful and accessible chemical analysis for surface and thin film characterization", retrieved from the internet, https://assests.thermofisher.com/TFS-Assets/MSD/brochures/BR5286-k-alpha-brochure.pdf, Jan. 1, 2017, 4 pages.

(Continued)

*Primary Examiner* — Jason L McCormack
(74) *Attorney, Agent, or Firm* — Mueting Raasch Group (57) ABSTRACT

Surface imaging apparatuses, surface analysis apparatuses, methods based on detection of secondary electrons or secondary ions that include a spatially scanned and DC or pulsed primary excitation source resulting in secondary electrons or secondary ions which are detected and provide the modulated signal for imaging of the sample; and dual polarity flood beams to effect neutralization of surface charge and surface potential variation.

26 Claims, 6 Drawing Sheets

(58) Field of Classification Search
CPC .... H01J 2237/2527; H01J 49/00; H01J 49/02; H01J 49/0418; H01J 49/0459; H01J 49/0463
USPC ....... 250/306, 307, 310, 311, 281, 282, 288, 250/423 R
See application file for complete search history.

(56) References Cited

U.S. PATENT DOCUMENTS

| | | | |
|---|---|---|---|
| 5,990,479 A * | 11/1999 | Weiss | G01N 33/533 850/61 |
| 7,067,821 B2 | 6/2006 | Barnard et al. | |
| 2005/0205800 A1* | 9/2005 | Barnard | H01J 37/026 250/423 R |
| 2006/0118711 A1* | 6/2006 | Murayama | H01J 49/40 250/287 |
| 2006/0188868 A1 | 8/2006 | Lloyd et al. | |
| 2015/0090874 A1* | 4/2015 | Larson | H01J 49/004 250/282 |

OTHER PUBLICATIONS

De Bruycker et al., "Mass spectrometry as a tool to advance polymer science", Nature Reviews in Chemistry, vol. 4, No. 5, Mar. 6, 2020, pp. 257-268.

International Search Report and Written Opinion from PCT App. No. PCT/US2021/048003, dated Jan. 4, 2022, 13 pages.

International Preliminary Report on Patentability from PCT App. No. PCT/US2021/048003, dated Aug. 12, 2022, 21 pages.

Suzuki et al., "Apparatus for positron-annihilation-induced Auger electron spectroscopy with a pulsed positron beam", Applied Surface Science, vol. 100-101, Jul. 2, 1996, pp. 297-300.

* cited by examiner

METHODS AND SYSTEMS INCLUDING PULSED DUAL-BEAM CHARGE NEUTRALIZATION

CONTINUING APPLICATION DATA

This application is the §371 U.S. National Stage of International Application No. PCT/US2021/048003, filed Aug. 27, 2021, which claims priority to U.S. Provisional Patent Application No. 63/071,542, filed Aug. 28, 2020, which are incorporated by reference herein in their entireties.

FIELD

This disclosure relates to, among other things, surface analysis apparatuses and methods.

SUMMARY

Herein, methods and systems for a pulsed, dual-beam and self-regulating charge compensation scheme that provides robust, turn-key analysis of semiconducting, dielectric and bulk insulator specimens in zero-field, high-field and pulsed extraction field configurations are disclosed and explained. The methods and systems employ a low-energy electron flood (e.g., ENeut, ≤100 eV) and a pulsed, low-energy ion flood (e.g., INeut, ≤100 eV) to achieve robust, turn-key analysis in both positive and negative polarities; typical operating conditions to ensure minimal surface charge accumulation and near zero accumulated molecular damage to the specimen can include <7 eV ENeut and ≤10 eV INeut. These new methods and systems are exemplified for the analysis of secondary electrons, negatively charged secondary ions and positively charged secondary ions. The dual-beam, self-regulating charge compensation systems and methods can accommodate working distances of 2 mm to 40 mm, having beam diameters of ≈3 mm (ENeut) and ≈10 mm (INeut), for example.

Disclosed methods and systems aim to establish a self-regulating charge compensation scheme for the analysis of semiconducting, dielectric and bulk insulator specimens in a zero-field, high-field or pulsed extraction field potential and using a charged particle, a neutral particle or a photon primary (also referred to as an analysis) beam. The primary beam may be either pulsed or continuous (DC). In the case of charged particle analysis, the disclosure is applied and may be observed to produce equal robustness and reliability in both the positive and the negative polarities. Likewise, the charge compensation scheme can be employed and is amenable to pulsed-mode analysis, in both the positive and the negative polarities, at repetition rates ranging from DC to tens of kilohertz (kHz). Moreover, disclosed charge compensation methods and systems serve to minimize observable or measurable damage to organic or other sensitive molecules, or otherwise fragile specimens, as a result of the applied charge compensation scheme. The qualification of self-regulating denotes that no parametric value is adjusted, or requires adjustment, in the course of an analysis to maintain the initial performance characteristics.

In some embodiments described herein, ion spectroscopic apparatuses comprise a pulsed primary excitation source which generates secondary ions to be mass analyzed, and dual polarity flood beams (electrons and pulsed positively charged ions) to effect neutralization of surface charge and surface potential variation. The pulsed charge neutralizing flood beams are interleaved (e.g., pulsed out of synchrony) with the pulsed primary excitation source.

Illustrative ion spectroscopic apparatuses and methods can include, for example time of flight-secondary ion mass spectrometry (TOF-SIMS) as well as other ion mass spectrometry techniques such as matrix assisted laser desorption/ionization (MALDI) or quadrupole or magnetic sector-based dynamic secondary ion mass spectroscopic (DSIMS) performed with a pulsed or DC primary beam, for example.

Also disclosed herein are time of flight-secondary ion mass spectroscopic (TOF-SIMS) apparatuses comprising, dual polarity flood beams (electrons and pulsed positively charged ions) to effect neutralization of surface charge and surface potential variation. The pulsed charge neutralizing flood beams are interleaved (e.g., pulsed out of synchrony) with the pulsed primary excitation ion beam of the TOF-SIMS instrument.

Further disclosed are surface analysis methods based on energy analysis of secondary electrons or mass analysis of secondary ions, comprising: a pulsed primary excitation source resulting in characteristic secondary electrons to be energy analyzed or secondary ions to be mass analyzed; and dual polarity flood beams (electrons and pulsed positively charged ions) to effect neutralization of surface charge and surface potential variation. The pulsed charge neutralizing flood beams are interleaved (e.g., pulsed out of synchrony) with the pulsed primary excitation source. Such systems may include surface analysis techniques wherein the excitation source is not necessarily pulsed and could specifically include, for example X-ray photoelectron spectroscopy (XPS) and Auger Electron spectroscopy (AES).

Also disclosed are surface analysis apparatuses based on energy analysis of secondary electrons or mass analysis of secondary ions, comprising: a direct current (DC) primary excitation source resulting in characteristic secondary electrons to be energy analyzed or secondary ions to be mass analyzed; and dual polarity flood beams (electrons and pulsed positively charged ions) to effect neutralization of surface charge and surface potential variation.

Also disclosed are surface imaging methods based on detection of secondary electrons or secondary ions, comprising: a spatially scanned and DC primary excitation source resulting in secondary electrons or secondary ions which are detected and provide the modulated signal for imaging of a sample; and dual polarity flood beams to effect neutralization of surface charge and surface potential variation.

Such methods or apparatuses can incorporate a pulse counting or digital detection scheme for collection of the energy selected secondary electrons, or mass selected secondary ions wherein the pulse counting is gated (e.g., suspended) during the time window in which either of the dual polarity flood beams are turned on so as to eliminate any spectral noise generated by the neutralization beams. Such methods and apparatuses can deal with noise problems from the pulsed neutralizers and provide a means to address it.

Also disclosed are surface imaging apparatuses based on detection of secondary electrons or secondary ions, comprising: a spatially scanned and pulsed primary excitation source resulting in secondary electrons or secondary ions which are detected and provide the modulated signal for gray scale imaging of the sample; and dual polarity flood beams (electrons and pulsed positively charged ions) to effect neutralization of surface charge and surface potential variation. The pulsed charge neutralizing flood beams are interleaved (e.g., pulsed out of synchrony) with the pulsed primary excitation source Also disclosed are surface imaging methods based on detection of secondary electrons or secondary ions, the methods comprise a spatially scanned and pulsed primary excitation source resulting in secondary electrons or secondary ions which are detected and provide the modulated signal for imaging (e.g., gray scale imaging) of a sample; and dual polarity flood beams (electrons and pulsed positively charged ions) to effect neutralization of surface charge and surface potential variation. The pulsed charge neutralizing flood beams are interleaved (e.g., pulsed out of synchrony) with the pulsed primary excitation source.

Such methods could allow application to surface imaging techniques wherein the excitation source is not necessarily but could be pulsed. These could include, for example scanning electron microscopy (SEM), focused ion beam (FIB), photoemission electron microscopy (PEEM), and low-energy electron microscopy (LEEM).

Also disclosed are surface imaging apparatuses based on detection of secondary electrons or secondary ions, that comprise: a spatially scanned and DC primary excitation source resulting in secondary electrons or secondary ions which are detected and provide the modulated signal for imaging, such as gray scale imaging, of the sample; and dual polarity flood beams (electrons and pulsed positively charged ions) to effect neutralization of surface charge and surface potential variation.

Also disclosed are surface imaging methods based on detection of secondary electrons or secondary ions, comprising: a spatially scanned and pulsed primary excitation source resulting in secondary electrons or secondary ions which are detected and provide the modulated signal for imaging (e.g., gray scale imaging) of a sample; and dual polarity flood beams (electrons and pulsed positively charged ions) to effect neutralization of surface charge and surface potential variation. The pulsed charge neutralizing flood beams are interleaved (e.g., pulsed out of synchrony) with the pulsed primary excitation source. Such apparatuses or methods can also incorporate pulse counting or digital detection schemes for collection of the secondary electrons, or secondary ions wherein the pulse counting is gated (suspended) during the time window in which either of the dual polarity flood beams are turned on in order to eliminate any spectral noise generated by the neutralization beams.

It is to be understood that both the foregoing general description and the following detailed description present embodiments of the subject matter of the present disclosure, and are intended to provide an overview or framework for understanding the nature and character of the subject matter of the present disclosure as it is claimed. The accompanying drawings are included to provide a further understanding of the subject matter of the present disclosure, and are incorporated into and constitute a part of this specification. The drawings illustrate various embodiments of the subject matter of the present disclosure and together with the description serve to explain the principles and operations of the subject matter of the present disclosure. Additionally, the drawings and descriptions are meant to be merely illustrative, and are not intended to limit the scope of the claims in any manner.

DETAILED DESCRIPTION

A problem often encountered in particle and photon analysis, wherein the particles or photons undergoing spectroscopic or spectrometric measurement are generated using a charged particle, a neutral particle or a photon primary beam, whether in a zero-field, high-field or pulsed extraction field potential, is that time varying changes of the sample surface potential and/or spatially varying surface potential, and/or accumulation of surface charge produces a variety of deleterious effects including decreased signal counts and signal intensity, decreased spectral resolution, and/or beam drift on the sample resulting in decreased imaging performance (e.g., lateral resolution); this is expressed in the analysis of semiconducting, dielectric and bulk insulator samples. Various techniques for negating these effects have been used in the past, with varying degrees of success; these techniques are commonly referred to as "charge neutralization techniques". An ideal method for charge neutralization of insulating samples would achieve six objectives:

First, and most importantly, it would provide effective charge neutralization; this means that no parametric value is adjusted, or requires adjustment, during an analysis to maintain the initial performance characteristics. Current state-of-the-art methods generally employ a combined dose of (negatively charged) electrons from an electron flood gun to prevent positive charge buildup in the primary beam analysis region and a smaller dose of (positively charged) ions to prevent negative charge buildup outside the primary beam region caused by higher energy or accelerated electrons produced either by the incident primary beam or present in the flooding electron beam.

Second, an ideal method would cause minimal damage to even the most fragile samples over a time long enough to acquire sufficient spectral data for the analysis (typically several minutes and up to an hour or longer). The damage of concern can be structural, compositional or chemical in nature. This necessitates the use of only low energy particles (electrons and/or ions) as well as a low dose of those particles. An ideal method must balance the need for a sufficient dose of charged particles to provide effective charge neutralization with the need for a small enough dose (and energy) of charged particles to prevent sample damage.

Third, an ideal method would contribute minimal spectral background, whether to the energy spectrum or to the mass spectrum of the secondary emitted species, depending on the employed spectroscopic method.

Fourth, an ideal method would provide turn-key operation; that is, once the apparatus is set up with all the beam control parameters selected (voltages, currents, pressures, duty cycles, pulse widths, etc.), it could be simply turned on/off and be effective for all sample types without further tuning of any of the beam control parameters.

Fifth, initial setup of an ideal method would be flexible, allowing access to the full range of each beam control parameter (to optimally achieve the first four objectives) independent of the other beam control parameters.

And sixth, initial setup of an ideal method would be simple, allowing adjustment of the electron and positive ion dose without affecting other beam characteristics such as beam size, shape, and position on the sample. Ideally, beam parameters controlling particle dose would be independent from parameters controlling beam size, shape and position.

None of the current state-of-the-art methods achieves all six of these objectives. There is a need, therefore, for an improved charge neutralization method. The present invention aims to achieve all six of the objectives described above.

Considering five common state-of-the-art charge neutralization methods in turn, each one is shown to fall short of meeting one or more of the six stated objectives:

Method one. U.S. Pat. No. 5,990,476 (assignee: Physical Electronics Inc, Eden Prairie, Minn.) discloses (continuous, non-pulsed) dual-beam charge neutralization employing separate electron and positive ion flood guns for XPS and other spectroscopic techniques. This method falls short of two of the stated objectives. First, initial setup is complicated because adjustment of beam control parameters to achieve the first four objectives affects not only electron and ion dose but also the electron and ion beam size and shape on the sample. Second, in rare cases of certain fragile samples this method requires further tuning of beam control parameters after initial setup in order to achieve, simultaneously, both effective charge neutralization and minimal sample damage.

Method two. U.S. Pat. No. 7,067,821 (assignee: Thermo Electron Corporation, Waltham, Mass.) discloses dual-beam charge neutralization using a coaxial electron-ion flood gun for XPS and other spectroscopic techniques. Here the electron and ion beams are extracted and focused concurrently in a single mode of operation with all the beam control parameters set at fixed values. Once selected, the various components of the combined flood gun and the potentials applied to them remain unchanged during operation. This method falls short because initial setup is neither flexible nor simple. A combined coaxial flood gun necessarily links several of the beam control parameters because the electron and ion beams are of opposite polarity, so there are severe limitations on the gun setup. To begin, the extraction potentials are limited (~10V) because both the electron and ion beams need to be drawn out of the gas ionization zone and focused to the sample simultaneously. This has several effects. With low extraction voltage the filament needs to be operated significantly hotter (on the order of 100° C.) than ideal to achieve sufficient emission; this reduces filament life and increases the energy spread of the electron beam, reducing charge compensation effectiveness. Further, the limited extraction potential limits the extracted current of both the electron and ion beams. Another performance limitation arises because the focusing capability of the lenses is also limited; one electric field necessarily either accelerates the positively charged ions and decelerates the negatively charged electrons, or vice versa. Both beams cannot be focused simultaneously under acceleration. Focusing under acceleration is preferred for higher performance, especially for beams at low energy and under nearly space charge-limited conditions. A combined coaxial electron-ion flood gun operated in simultaneous mode has intrinsic performance limitations.

Method three. It is also disclosed in U.S. Pat. No. 7,067,821 that a combined electron-ion flood gun can be operated in an alternating dual-mode of operation in an attempt to mitigate some of the previously mentioned limitations. The extraction and focusing assembly is arranged to extract and focus the electron beam and the positive particle ion beam alternately, in an electron beam mode and an ion beam mode, respectively. Potentials applied to the various components are switched from one set of values to a second set of values between the two modes. The extraction and focusing assembly may be switched in either mode to accelerate the respective beam, and extraction potentials may be large (~100 V) for increased electron and ion beam currents because only one polarity particle is being extracted in each mode. What is not switched, however, is the gas pressure. It is always on whether in the ion beam or electron beam mode. Consequently, with the gas pressure on and a high extraction voltage employed, high energy positively charged ions are generated even in the electron beam mode. A central beam stop can be employed to prevent most of these high energy ions from reaching the sample; however, some of these high energy ions can reach the sample and cause sample damage. Also, the central stop limits the maximum achievable ion and electron beam currents. A further complication of the alternating dual beam mode is that to achieve the most effective operation more than one potential must be alternately pulsed. For best performance the extraction electrode voltage, focusing lens voltage, and the gas ionization cell voltage must all be alternated together. Another complication is that the beam is uncontrolled momentarily during the alternating transition between the two modes. This can lead to uncontrolled focusing and inadvertent high energy particles which can damage fragile samples. A final limitation of the alternating mode is that the ion and electron beams cannot be simultaneously delivered to the sample, limiting the dose rate of each.

Method four. In positive ion polarity TOF-SIMS, a common method of charge neutralization is to employ a continuous, non-pulsed (direct current, DC) neutralizing positive ion beam from an ion flood gun along with a pulsed electron beam from a separate electron flood gun. The positive ion beam reaches the sample only when the strong extraction field in the sample region is turned off for neutralization. With this method the electron beam duty cycle cannot be decoupled from the neutralizing ion beam because the neutralizing ion beam is incident on the sample when the extraction field is off. So, to control electron beam dose, typically only the electron beam current can be varied and not the duty cycle. Also, with a continuous neutralizing ion beam, setup is complicated because control of the ion dose is linked to beam size and shape. A further complication is that high voltage reflections (a.k.a "ringing") in the extraction field power supply voltage amplitude during high speed switching may cause the neutralizing ion beam to be momentarily accelerated to high energy, causing sample damage. And finally, with a continuous neutralizing ion beam there can be a higher spectral background contribution from scattered particles (such as neutrals) that reach the sample even with the extraction field on and the positive ions repelled.

Method five. In negative ion polarity TOF-SIMS, a common method of charge neutralization is to employ a pulsed electron flood gun only. No separate non-pulsed neutralizing positive ion beam flood gun is used because the ions would be accelerated to high energy by the extraction field and damage the sample. This method does not provide effective charge neutralization. Parts of the sample may charge up to hundreds of electron volts and then act to repel further flooding low energy electrons which are needed to neutralize the positive charge, produced by the incident analytical primary beam, in the analysis region. The net negative charge developed around the analysis region also effectively defocuses any focused electron beam from the electron flood gun. To compensate for this effect, the electron energy is typically increased to ≈25 eV. But this is still not successful. Without the positive ions neutralizing the surrounding negative charge, not enough electrons reach the primary beam irradiation region of the sample. Also, for some delicate samples this electron energy is too high and can cause damage. For example, thin-film dielectrics have a leakage path, so electron-stimulated bond breakage can occur. In addition to a flooding electron gun, method five can optionally employ the admission of a gas near the sample region. However, only a relatively small proportion of the gas admitted is ionized by the flooding electrons passing through the gas; the ions generated are not focused to the sample, so they arrive as an ineffective diffuse flood of ions. Because there is no means of focusing the ions and only a relatively low gas pressure can be admitted, the ion current generated is of limited effectiveness.

The present disclosure introduces a new charge compensation method that effectively achieves all six objectives: pulsed dual-beam charge neutralization. In this method separate electron and ion flood guns can be controlled independently of each other, including all parameters related to pulsed versus non-pulsed operation. This method provides effective charge neutralization for all techniques, including negative secondary ion spectroscopy TOF-SIMS, where a positive ion beam can now be employed because it is pulsed on only when the extraction field is off. Adding the pulsed ion beam allows the electron beam energy to be reduced to approximately <5 eV, minimizing sample damage due to high particle energy. Low-dose operation employing a limited duty cycle and pulse width also minimizes sample damage. Further, the method contributes a negligible amount of spectral background by employing electron and ion columns designed to eliminate any high energy directly emitted or scattered species. Once set up, its operation is remarkably robust and turn-key for all samples and spectrometer acquisition settings, requiring no further tuning of the beam control parameters. The method further affords the analytical benefit of robust automation and unattended analysis. Since time varying changes in the sample surface potential are eliminated, it is straight forward to automate the analysis of multiple areas of one specimen or of multiple specimens. Set up is wholly flexible using two independent columns for the ion and electron beams, resulting in optimum performance of each. And setup is simple in that the electron and ion dose can be controlled independently via duty cycle, timing and pulse width of each gun, having no effect on important beam characteristics such as beam size, shape and position on the sample, which are set up independently from dose.

Prior to experimentally testing dual-beam charge neutralization it was not obvious that it would work, and certainly not obvious that it would work so extremely well. It was uncertain that it could effectively achieve all six objectives stated above simultaneously. No other current state-of-the-art method could accomplish these goals. By individual control of each beam's duty cycle, pulse width, pulse timing, energy and current these remarkable results were obtained. Doubts also centered on whether the ion beam could be pulsed significantly faster than the charging time constant of the sample surface and its surroundings and yet deliver a high enough dose to maintain the potential of the sample surface at a substantially constant value.

Dual-beam charge neutralization is especially relevant to XPS and TOF-SIMS spectroscopic analysis techniques, but it is also applicable to other energy, mass and photon analysis techniques where the sample potential is important, for example, AES, SIMS, EDX and UPS. Another possible application is in the MALDI technique where slides must be coated with indium tin oxide (ITO) to prevent charging. If an ITO slide coating could be eliminated by dual-beam charge neutralization it would be much easier to get well prepared samples by employing bare glass slides or even doing the analysis using specimens which include the growth media.

The method and design employs both an optionally pulsed, low-energy electron flood (i.e. ENeut, 100 eV) and a pulsed, low-energy ion flood (i.e. Ineut, ≤100 eV) to achieve robust, turn-key analysis in both the positive and the negative polarities; typical operating conditions to ensure zero accumulated molecular damage to the specimen are <7 eV Eneut and <10 eV Ineut. This new method is demonstrated herein in the analysis of secondary electrons, negatively charged secondary ions and positively charged secondary ions. The correct functioning of the dual-beam, self-regulating charge compensation system accommodates a working distance of 2 mm to 40 mm, having beam diameters of ≈3 mm (Eneut) and ≈10 mm (Ineut).

FIGS. 1A to 1D show schematic illustrations of the timings of the analysis beam (FIG. 1A), the extraction field (FIG. 1B), the ion flood beam (FIG. 1C) and the electron flood beam (FIG. 1D) in a pulsed extraction field at a frequency of ≈5 kHz. Note that the operating frequency can be significantly increased or decreased depending on the desired spectroscopic or spectrometric range. Further, the extraction field can be offset in time to achieve a delayed extraction enhancement.

FIGS. 1E, 1F, 1G, and 1H show a schematic illustration of the timing of the on and off states of another version of the analysis beam (FIG. 1E), the extraction field (FIG. 1F), the ion flooding beam (FIG. 1G), and the electron flooding beam (FIG. 1H) in accordance with a disclosed method in which the electron flooding beam is delayed and of shorter duration than the ion flooding beam. This is provided as only one example illustrative of the fact that the pulsing frequency, duty cycle and relative timing of the primary beam, extraction field, Eneut beam and Ineut beam can all be varied independently to maximize measurement throughput and charge neutralization while minimizing any sample damage.

Disclosed apparatuses and methods provide effective control of specimen surface potential where, for example, a 5 nanoamperes (nA) (DC-measured) pulsed Bi ion beam can be rastered over an irradiation region as small as 5 µm, with an Ineut energy of 10 eV and the electron energy can be lowered to about 5 eV. This result is achieved with no loss of signal or decrease in mass resolution. Besides effectively controlling specimen surface potential, this approach also reduces specimen damage to a low level because of the low electron energy and associated low positive ion dose. This is a satisfactory solution to the problem for positive TOF-SIMS except for the most delicate specimens.

In contrast, to avoid the problem of increased spectral background and high specimen damage in negative TOF-SIMS, the prior art uses either a continuous or pulsed flooding electron source only. No positive ions are directed toward the specimen to neutralize the negative charging of the flooding area. The resulting negative charge increases the minimum electron energy necessary to reach the flooding area to 25 eV or more; moreover, the minimum raster size is limited to about 50-100 µm to avoid loss of signal or a decrease in mass resolution arising from a time varying (i.e. unstable) surface potential. This is not a satisfactory solution to the problem for negative TOF-SIMS; small areas and higher magnification cannot be irradiated for analysis, and specimen damage is too high.

Another problem to be solved, therefore, is how to effectively control the specimen surface potential in negative TOF-SIMS while simultaneously minimizing specimen damage. One method disclosed herein is to pulse on both the flooding electrons and the positive ions while the extraction field is pulsed off. To avoid specimen damage, the positive ion beam must be pulsed off completely when the extraction field is pulsed on for analysis, and this typically occurs at kilohertz (kHz) frequency.

Figure 1A:
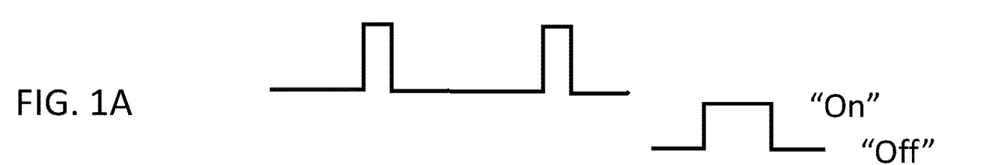
FIGS. 1A, 1B, 1C and 1D show a schematic illustration of the timing of the on and off states of the analysis beam (FIG. 1A), the extraction field (FIG. 1B), the ion flooding beam (FIG. 1C), and the electron flooding beam (FIG. 1D) in accordance with a disclosed method.
Figure 1B:
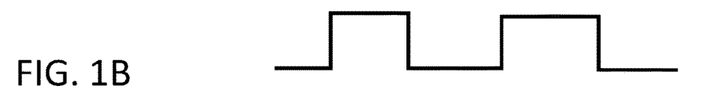
Figure 1C:
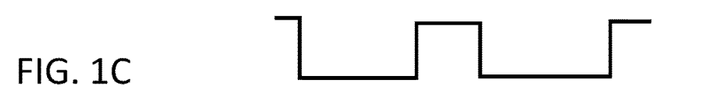
Figure 1D:
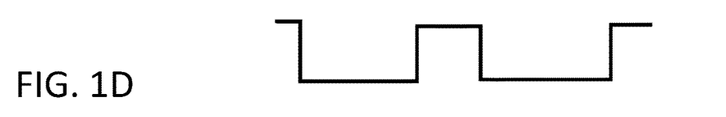
Figure 1E:
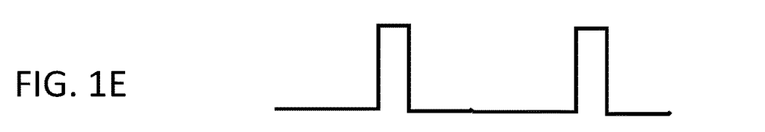
FIGS. 1E, 1F, 1G, and 1H show a schematic illustration of the timing of the on and off states of another version of the analysis beam (FIG. 1E), the extraction field (FIG. 1F), the ion flooding beam (FIG. 1G), and the electron flooding beam (FIG. 1H) in accordance with a disclosed method in which the electron flooding beam is delayed and of shorter duration than the ion flooding beam.
Figure 1F:
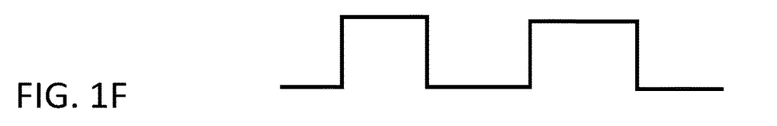
Figure 1G:
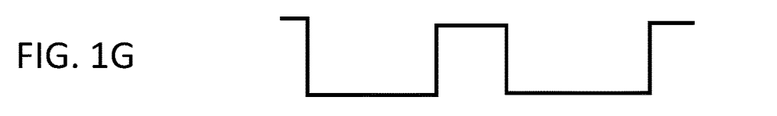
Figure 1H:
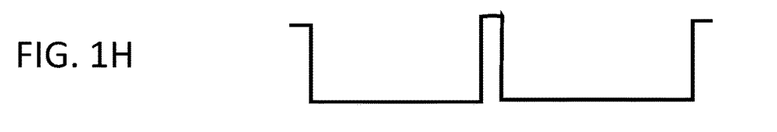
Figure 2:
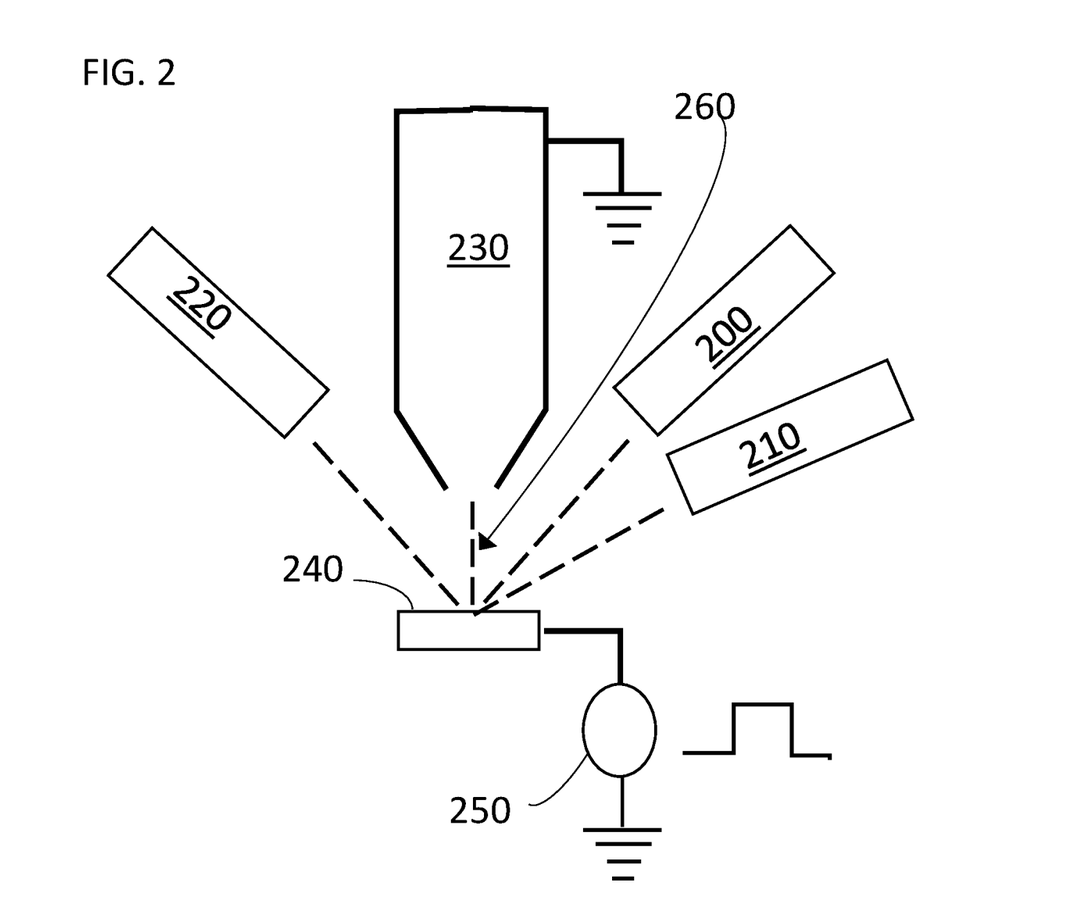
FIG. 2 shows a schematic illustration of a system that can be utilized herein as a surface analysis system.

Disclosed systems can include, for example a source of a pulsed excitation (e.g., primary) beam 200 (creating, for example, a source of secondary ions 260), a source of a pulsed ion flood neutralizer beam 210, a source of an electron flood neutralizer beam 220 (that may be pulsed or DC), a mass spectrometer 230, all of which are directed towards the sample being analyzed 240. The sample being analyzed 240 is electrically connected to a voltage supply that can be configured to pulse the sample.

Completely pulsing off an ion beam generated from, for example, a gas ionizer is difficult because of two complications. First, some small fraction of ions in an ion beam directed away from the specimen scatter off apertures or other surfaces at just the right angle to be directed back toward the specimen. Second, the gas ionizer can produce up to several percent of high energy neutral species by a charge exchange process well known in the art. These neutral species cannot be directed by electric or magnetic fields but must be stopped by physical barriers to eliminate both direct line-of-sight to the specimen and scattering off apertures or other surfaces to reach the specimen. Consequently, completely pulsing off an ion beam of a few nA current for neutralization (over ten orders of magnitude) is a difficult design challenge.

However, using disclosed combination of apparatuses, such as those disclosed herein, it is possible to nearly completely pulse off an ion beam. An example with one pulsed apparatus: one or both plates of an electric dipole can be pulsed to sweep the positive ions off an aperture, directing them away from the specimen. This is combined with a downstream column offset (which directs the beam first at an angle away from the specimen then at a second angle back toward the specimen). The offset is designed such that no aperture or surface in the column has a direct line of sight to both the ion source and the specimen. This blocks the direct path of line-of-sight neutral species, as well as all particles scattered once in the column, from reaching the specimen. Only a trivial number of ions or neutral species scatter twice from surfaces at just the right angles to be directed back toward the specimen.

An example with two pulsed apparatuses: a pulsed extraction electrode can nearly completely pulse off a gas ionizer by reverse biasing the potentials. This is combined with pulsing one or both plates of a downstream electric dipole to remove residual ions in the beam. The pulsed extraction apparatus and method is disclosed in U.S. Pat. No. 7,067,821 (assignee: Thermo Electron Corporation, Waltham, Mass.).

Those skilled in the art may devise other methods and apparatuses for nearly complete pulsing off an ion beam, employing one or more pulsed apparatuses in combination. These are all intended to be covered by the inventive method of pulsed dual-beam charge neutralization disclosed herein.

The results of pulsing on both the flooding electrons and the positive ions while the extraction field is pulsed off is a satisfactory solution to the specimen charging problem for negative TOF-SIMS. It is equally as effective as the prior art solution for positive TOF-SIMS, but further minimizes potential damage of fragile specimens by reducing the positive ion dose. A 5 nA (DC measured) pulsed Bi ion beam can be rastered over an irradiation region as small as 5 µm, and the electron energy can be lowered to about 5 eV with an neutralizing ion energy of 10 eV. This result is achieved with no loss of signal or decrease in mass resolution. Besides effectively controlling specimen surface potential, this approach also reduces specimen damage because of the lower electron energy and associated lower positive ion dose. Furthermore, by eliminating neutral species and scattered particles from the ion beam reaching the sample in both negative and positive TOF-SIMS, even the most delicate specimens are protected from damage. Consequently, the disclosed method is superior to the prior art for both negative and positive TOF-SIMS. The method provides robust and turn-key control of specimen surface potential and is very flexible in its application because of improved control of energy, current and duty-cycle of both the electron and the positive ion beams.

Disclosed herein are embodiments where TOF-SIMS apparatuses comprising dual polarity flood beams (electrons and pulsed positively charged ions) to effect neutralization of surface charge and surface potential variation. The pulsed charge neutralizing flood beams are interleaved (i.e. pulsed out of synchrony) with the pulsed primary excitation ion beam of the TOF-SIMS instrument.

Disclosed herein are embodiments where TOF-SIMS methods utilizing dual polarity flood beams (electrons and pulsed positively charge ions) to effect neutralization of surface charge and surface potential variation. The pulsed charge neutralizing flood beams are interleaved (i.e. pulsed out of synchrony) with the pulsed primary excitation ion beam of the TOF-SIMS instrument.

Also disclosed are embodiments where ion spectroscopic apparatuses comprising a pulsed primary excitation source which generates secondary ions to be mass analyzed, and dual polarity flood beams (electrons and pulsed positively charged ions) to effect neutralization of surface charge and surface potential variation. The pulsed charge neutralizing flood beams are interleaved (i.e. pulsed out of synchrony) with the pulsed primary excitation source Further disclosed are embodiments where an ion spectroscopic method comprising a pulsed primary excitation source which generates secondary ions to be mass analyzed, and dual polarity flood beams (electrons and pulsed positively charged ions) to effect neutralization of surface charge and surface potential variation. The pulsed charge neutralizing flood beams are interleaved (i.e. pulsed out of synchrony) with the pulsed primary excitation source.

Disclosed herein are embodiments where TOF-SIMS apparatuses comprising dual pulsed polarity flood beams (both pulsed electrons and pulsed positively charged ions) to effect neutralization of surface charge and surface potential variation. The charge neutralizing flood beams are interleaved (i.e. pulsed out of synchrony) with the pulsed primary excitation ion beam of the TOF-SIMS instrument.

Disclosed herein are embodiments where TOF-SIMS methods utilizing pulsed dual polarity flood beams (both pulsed electrons and pulsed positively charge ions) to effect neutralization of surface charge and surface potential variation. The charge neutralizing flood beams are interleaved (i.e. pulsed out of synchrony) with the pulsed primary excitation ion beam of the TOF-SIMS instrument.

Also disclosed are embodiments where ion spectroscopic apparatuses comprising a pulsed primary excitation source which generates secondary ions to be mass analyzed, and pulsed dual polarity flood beams (both pulsed electrons and pulsed positively charged ions) to effect neutralization of surface charge and surface potential variation. The charge neutralizing flood beams are interleaved (i.e. pulsed out of synchrony) with the pulsed primary excitation source.

Further disclosed are embodiments where an ion spectroscopic method comprising a pulsed primary excitation source which generates secondary ions to be mass analyzed, and pulsed dual polarity flood beams (both pulsed electrons and pulsed positively charged ions) to effect neutralization of surface charge and surface potential variation. The charge neutralizing flood beams are interleaved (i.e. pulsed out of synchrony) with the pulsed primary excitation source.

Such embodiments could apply to other ion mass spectrometry techniques such as MALDI or quadrupole or magnetic-sector DSIMS performed with a pulsed primary beam.

Also disclosed are embodiments of surface analysis apparatus based on energy analysis of secondary electrons or mass analysis of secondary ions, comprising: a pulsed primary excitation source resulting in characteristic secondary electrons to be energy analyzed or secondary ions to be mass analyzed; and dual polarity flood beams (electrons and pulsed positively charged ions) to effect neutralization of surface charge and surface potential variation. The pulsed charge neutralizing flood beams are interleaved (i.e. pulsed out of synchrony) with the pulsed primary excitation source.

Also disclosed are embodiments of surface analysis method based on energy analysis of secondary electrons or mass analysis of secondary ions, comprising: a pulsed primary excitation source resulting in characteristic secondary electrons to be energy analyzed or secondary ions to be mass analyzed; and dual polarity flood beams (electrons and pulsed positively charged ions) to effect neutralization of surface charge and surface potential variation. The pulsed charge neutralizing flood beams are interleaved (i.e., pulsed out of synchrony) with the pulsed primary excitation source.

Also disclosed are embodiments where a surface analysis apparatus based on energy analysis of secondary electrons or mass analysis of secondary ions, comprising: a pulsed primary excitation source resulting in characteristic secondary electrons to be energy analyzed or secondary ions to be mass analyzed; and pulsed dual polarity flood beams (both pulsed electrons and pulsed positively charged ions) to effect neutralization of surface charge and surface potential variation. The pulsed charge neutralizing flood beams are interleaved (i.e. pulsed out of synchrony) with the pulsed primary excitation source.

Also disclosed are embodiments of surface analysis method based on energy analysis of secondary electrons or mass analysis of secondary ions, comprising: a pulsed primary excitation source resulting in characteristic secondary electrons to be energy analyzed or secondary ions to be mass analyzed; and pulsed, dual polarity flood beams (both pulsed electrons and pulsed positively charged ions) to effect neutralization of surface charge and surface potential variation. The charge neutralizing flood beams are interleaved (i.e., pulsed out of synchrony) with the pulsed primary excitation source.

Such embodiments could apply to surface analysis techniques wherein the excitation source is not necessarily pulsed but could be e.g. XPS and AES.

Also disclosed are embodiments where a surface analysis apparatus based on energy analysis of secondary electrons or mass analysis of secondary ions, comprising: a DC primary excitation source resulting in characteristic secondary electrons to be energy analyzed or secondary ions to be mass analyzed; and dual polarity flood beams (electrons and pulsed positively charged ions) to effect neutralization of surface charge and surface potential variation.

Also disclosed are embodiments of surface analysis methods based on energy analysis of secondary electrons or mass analysis of secondary ions, comprising: a DC primary excitation source resulting in characteristic secondary electrons to be energy analyzed or secondary ions to be mass analyzed; and a dual polarity flood beams (electrons and pulsed positively charged ions) to effect neutralization of surface charge and surface potential variation.

Also disclosed are embodiments where a surface analysis apparatus based on energy analysis of secondary electrons or mass analysis of secondary ions, comprising: a DC primary excitation source resulting in characteristic secondary electrons to be energy analyzed or secondary ions to be mass analyzed; and pulsed dual polarity flood beams (both pulsed electrons and pulsed positively charged ions) to effect neutralization of surface charge and surface potential variation.

Also disclosed are embodiments of surface analysis methods based on energy analysis of secondary electrons or mass analysis of secondary ions, comprising: a DC primary excitation source resulting in characteristic secondary electrons to be energy analyzed or secondary ions to be mass analyzed; and pulsed dual polarity flood beams (both pulsed electrons and pulsed positively charged ions) to effect neutralization of surface charge and surface potential variation.

Such embodiments could apply to surface analysis instruments utilizing a DC primary beam.

Such embodiments could also apply to an apparatus or a method as described above but which incorporates a pulse counting or digital detection scheme for collection of the energy selected secondary electrons, or mass selected secondary ions wherein the pulse counting is gated (suspended) during the time window in which either of the dual polarity flood beams are turned on so as to eliminate any spectral noise generated by the neutralization beams.

Such embodiments could anticipate a noise problem from the pulsed neutralizers and provide means to address it.

Also disclosed are embodiments of surface imaging apparatuses based on detection of secondary electrons or secondary ions, comprising: a spatially scanned and pulsed primary excitation source resulting in secondary electrons or secondary ions which are detected and provide the modulated signal for gray scale imaging of the sample; and a dual polarity flood beams (electrons and pulsed positively charged ions) to effect neutralization of surface charge and surface potential variation. The pulsed charge neutralizing flood beams are interleaved (i.e. pulsed out of synchrony) with the pulsed primary excitation source.

Also disclosed are embodiments of surface imaging methods based on detection of secondary electrons or secondary ions, comprising: a spatially scanned and pulsed primary excitation source resulting in secondary electrons or secondary ions which are detected and provide the modulated signal for gray scale imaging of a sample; and a dual polarity flood beams (electrons and pulsed positively charged ions) to effect neutralization of surface charge and surface potential variation. The pulsed charge neutralizing flood beams are interleaved (i.e. pulsed out of synchrony) with the pulsed primary excitation source.

Also disclosed are embodiments of surface imaging apparatuses based on detection of secondary electrons or secondary ions, comprising: a spatially scanned and pulsed primary excitation source resulting in secondary electrons or secondary ions which are detected and provide the modulated signal for gray scale imaging of the sample; and dual polarity flood beams (both pulsed electrons and pulsed positively charged ions) to effect neutralization of surface charge and surface potential variation. The pulsed charge neutralizing flood beams are interleaved (i.e. pulsed out of synchrony) with the pulsed primary excitation source.

Also disclosed are embodiments of surface imaging methods based on detection of secondary electrons or secondary ions, comprising: a spatially scanned and pulsed primary excitation source resulting in secondary electrons or secondary ions which are detected and provide the modulated signal for gray scale imaging of a sample; and dual polarity flood beams (both pulsed electrons and pulsed positively charged ions) to effect neutralization of surface charge and surface potential variation. The pulsed charge neutralizing flood beams are interleaved (i.e. pulsed out of synchrony) with the pulsed primary excitation source.

Such embodiments could allow application to surface imaging techniques wherein the excitation source is not necessarily pulsed but could be. This could include SEM, FIB, PEEM, LEEM, etc.

Also disclosed are embodiments of surface imaging apparatus based on detection of secondary electrons or secondary ions, comprising: a spatially scanned and DC primary excitation source resulting in secondary electrons or secondary ions which are detected and provide the modulated signal for gray scale imaging of the sample; and dual polarity flood beams (electrons and pulsed positively charged ions) to effect neutralization of surface charge and surface potential variation.

Also disclosed are surface imaging methods based on detection of secondary electrons or secondary ions, comprising: a spatially scanned and pulsed primary excitation source resulting in secondary electrons or secondary ions which are detected and provide the modulated signal for gray scale imaging of a sample; and dual polarity flood beams (electrons and pulsed positively charged ions) to effect neutralization of surface charge and surface potential variation. The charge neutralizing flood beams are interleaved (i.e. pulsed out of synchrony) with the pulsed primary excitation source.

Also disclosed are embodiments of surface imaging apparatus based on detection of secondary electrons or secondary ions, comprising: a spatially scanned and DC primary excitation source resulting in secondary electrons or secondary ions which are detected and provide the modulated signal for gray scale imaging of the sample; and pulsed dual polarity flood beams (both pulsed electrons and pulsed positively charged ions) to effect neutralization of surface charge and surface potential variation.

Also disclosed are surface imaging methods based on detection of secondary electrons or secondary ions, comprising: a spatially scanned and pulsed primary excitation source resulting in secondary electrons or secondary ions which are detected and provide the modulated signal for gray scale imaging of a sample; and pulsed dual polarity flood beams (both pulsed electrons and pulsed positively charged ions) to effect neutralization of surface charge and surface potential variation. The charge neutralizing flood beams are interleaved (i.e. pulsed out of synchrony) with the pulsed primary excitation source.

Use of methods, systems and apparatuses where the electron flood beam is DC and the ion beam is pulsed may provide a simpler set up than instances where both the electron and the ion beam are pulsed. Furthermore, it is known that the ion beam is the predominant source of sample damage from the neutralizing beams so systems, etc. where the electron beam is DC still serves to minimize sample damage. Such systems allow all the same advantages associated with using a pulsed ion beam to optimize the ion dose versus trying to change the current or current density of a DC ion beam.

Furthermore, it should be noted that a pulsed beam does not imply that the "off" state is fully blanked (i.e., has 100% attenuation). To the contrary, the instant disclosure contemplates that the second state in a pulsed beam covers all states and ranges of temporal intensity modulation.

Such embodiments could additionally incorporate a pulse counting or digital detection scheme for collection of the secondary electrons, or secondary ions wherein the pulse counting is gated (suspended) during the time window in which either of the dual polarity flood beams are turned on so as to eliminate any spectral noise generated by the neutralization beams.

In addition to the above stated benefits of this turn-key dual-beam method of charge neutralization, the method further affords the analytical benefit of robust automation and unattended analysis. That is to say, since time varying changes in the sample surface potential are eliminated, it is straight forward to automate the analysis of multiple areas of one specimen or of multiple specimens.

DEFINITIONS

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising" and the like. As used herein, "consisting essentially of," as it relates to a composition, product, method or the like, means that the components of the composition, product, method or the like are limited to the enumerated components and any other components that do not materially affect the basic and novel characteristic(s) of the composition, product, method or the like.

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Also herein, the recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

As used herein, the term "about" encompasses the range of experimental error that occurs in any measurement.

Any patent or non-patent literature cited herein, including provisional patent applications, is hereby incorporated herein by reference in its entirety to the extent that it does not conflict with the disclosure presented herein.

One of skill in the art will understand that one or more materials, articles, compositions, processes, and the like disclosed in one or more patent and non-patent literature cited herein can be modified to obtain a process, monomer, polymer or the like described herein.

In the description above several specific embodiments of compounds, compositions, products and methods are disclosed. It is to be understood that other embodiments are contemplated and may be made without departing from the scope or spirit of the present disclosure. The description, therefore, is not to be taken in a limiting sense.

EXAMPLES

Figure 3:
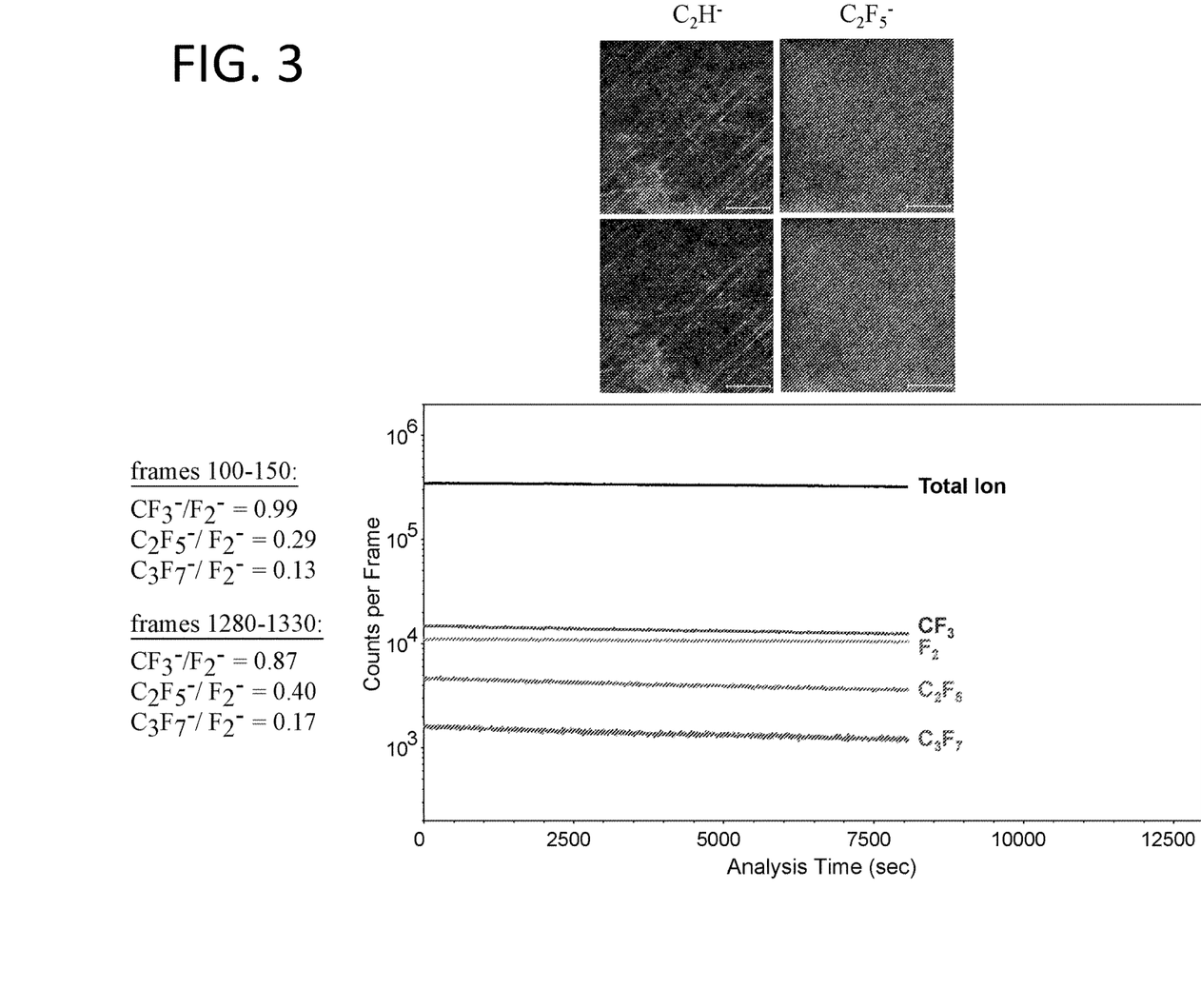
FIG. 3 shows an accumulated damage test of bulk insulating PTFE (2 mm-thick) measured in the negative polarity without the use of an ion neutralization method.

FIG. 3 shows results of a disclosed method and system being used to show the accumulated damage test of bulk insulating PTFE (2 mm-thick); INeut—OFF. Each of the ion ratios indicate a larger variation ($\approx$12-38%) relative to the data collected with INeut—ON (i.e. FIG. 4); therefore, any accumulated damage is indistinguishable from statistical variation. The data was collected in the negative ion polarity using a 30 keV primary beam of $Bi_3^+$ ions at a DC current of 5 nA. The imaging area was 400 µm×400 µm at a pixel density of 256×256; data was collected to a primary ion dose density (PIDD) of $5.08 \times 10^{12}$ $Bi_3^+/cm^2$ over a period of approximately 180 min. The signals plotted as a function of time, and their nominal mass-to-charge ratios (m/z), are the Total Ion, $F_2^-$ (m/z 38), $CF_3^-$ (m/z 69), $C_2F_5^-$ (m/z 119) and $C_3F_7^-$ (m/z 169). The thermal-scaled images indicate the X,Y spatial variation of the $C_2H^-$ (m/z 25, left column) and $C_2F_5^-$ (right column) ion signals; the scale bar is 100 µm. The top row images are comprised of 50 image frames (i.e. primary beam pulses per pixel) near the beginning of the 180 minute analysis and the bottom row images are comprised of 50 image frames at the end of the 180 minute analysis; the images indicate almost no change in the ion distributions as a function of time (i.e. primary beam dose). The $CF_3^-/F_2^-$, $C_2F_5^-/F_2^-$ and $C_3F_7^-/F_2^-$ ion ratios were used to gauge molecular damage as a function of time (i.e. primary beam dose).

Figure 4:
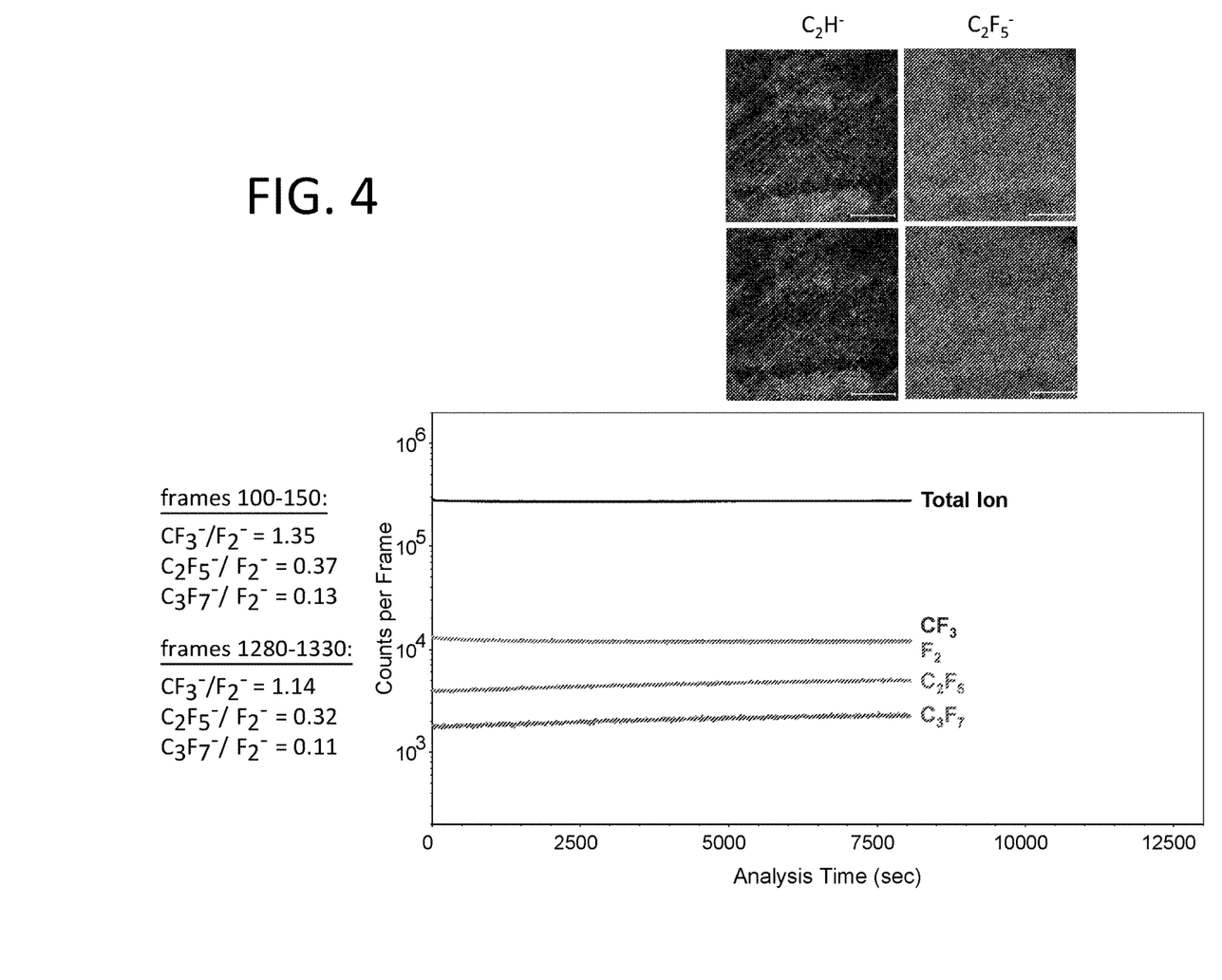
FIG. 4 shows accumulated damage test of bulk insulating PTFE (2 mm-thick) measured in the negative polarity while using an ion neutralization method.

FIG. 4 shows results of a disclosed method and system being used to show the accumulated damage test of bulk insulating PTFE (2 mm-thick); INeut—ON. Each of the ion ratios indicate moderate variation ($\approx$15%) but which is accommodated within the variation of the control measurement shown in FIG. 3. All test conditions and measurements are identical to those disclosed in FIG. 3, but at a different location of the same test specimen.

Figure 5:
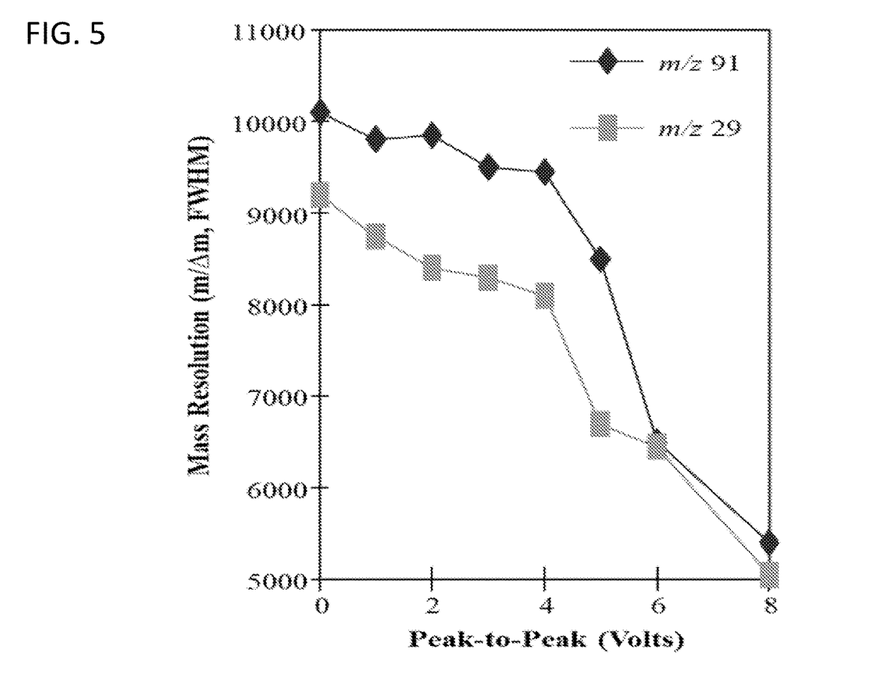
FIG. 5 shows a disclosed method and system being used to show the mass resolution measured as the full-width at half maximum (FWHM) plotted versus the deviation from the normal pulsed extraction field potential (i.e. 3 kV) in peak-to-peak Volts.

FIG. 5 shows disclosed method and system being used to illustrate the mass resolution measured as the full-width at half maximum (FWHM) plotted versus the deviation from the normal pulsed extraction field potential (i.e. 3 kV) in peak-to-peak Volts. In summary, the data reveal that a variation in the surface potential of <3 V produces a loss of mass resolution and, thus, a reduction of ion identification capability. The data was collected from a sample of bulk insulating poly(styrene) in the positive ion polarity using a 30 keV primary beam of $Ga^+$ ions. The signals plotted as a function of voltage, and their nominal mass-to-charge ratios (m/z), are $C_2H_5^+$ (m/z 29) and $C_7H_7^+$ (m/z 91).

Figure 6:
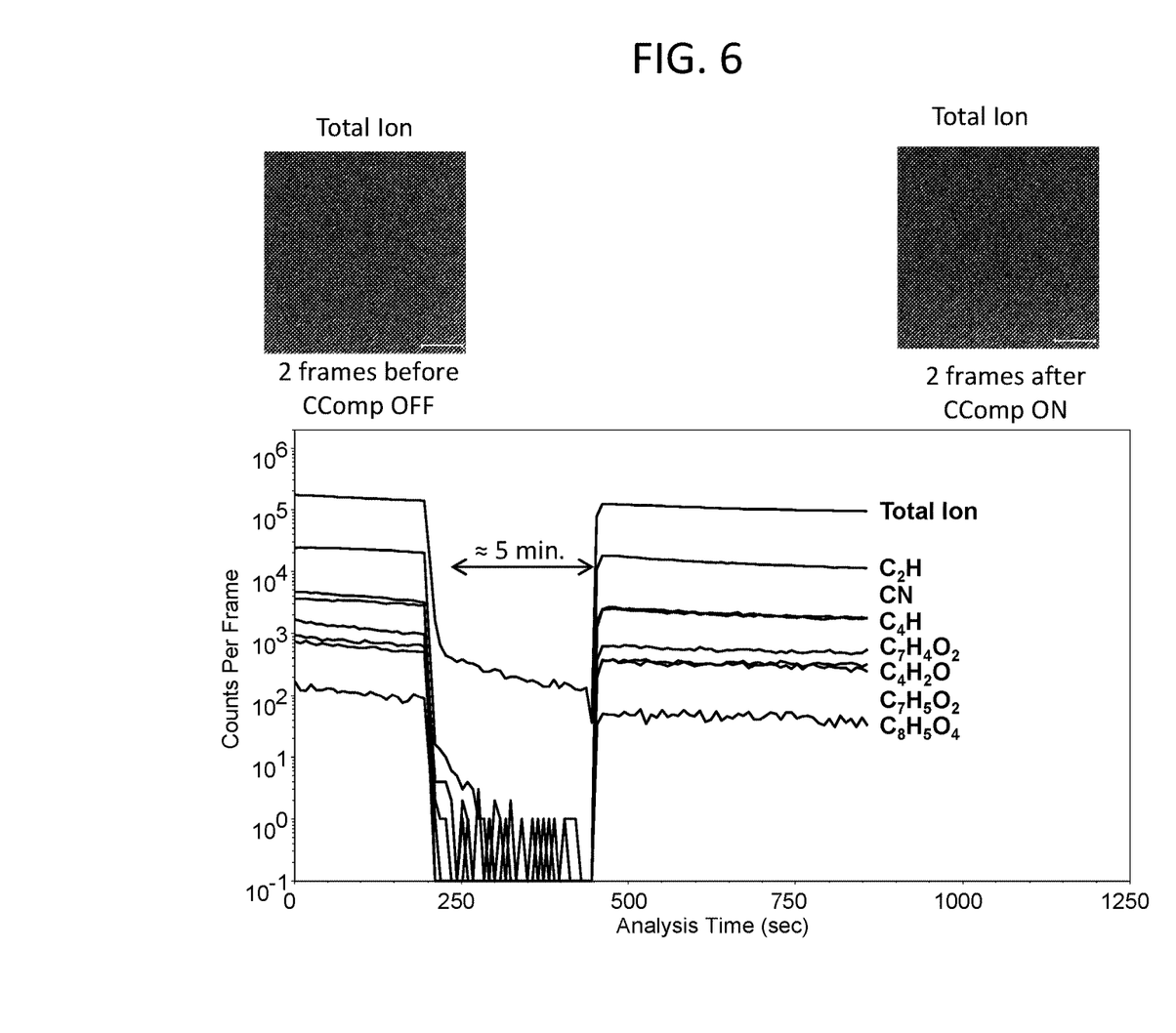
FIG. 6 shows integrated counts for various secondary ion signals measured as a function of collection time in the negative ion polarity from a bulk insulating specimen of poly(ethylene terephthalate) (PET) polymer.

FIG. 6 shows integrated counts for various secondary ion signals measured as a function of collection time from a bulk insulating specimen of poly(ethylene terephthalate) (PET) polymer. The data was collected in the negative ion polarity using a 30 keV primary beam of $Bi_3^+$ ions at a DC current of 5 nA. The operating frequency was 8.3 kHz and the analytical field-of-view (FOV) was 5 µm. Stable charge neutralization was achieved with typical settings of 25 eV $e^-$ and 10 eV $Ar^+$ for the ENeut and INeut, respectively. To check the robustness of the charge neutralization, the neutralizers were disengaged for approximately 5 minutes during the analysis, wherein the analytical ion beam continued to irradiate the sample; when the neutralizers were reengaged, the prior data rate and data quality (as noted by the uniform Total Ion images) was instantaneously recovered. The signals plotted as a function of time, and their nominal mass-to-charge ratios (m/z), are the Total Ion, $C_2H^-$ (m/z 25), $CN^-$ (m/z 26), $C_4H^-$ (m/z 49), $C_4H_2O^-$ (m/z 66), $C_7H_4O_2^-$ (m/z 120), $C_7H_5O_2^-$ (m/z 121) and $C_8H_5O_4^-$ (m/z 165). The thermal-scaled images indicate the X,Y spatial variation of the total ion signal in the 2 images frames directly prior to disabling and directly following reenabling both the ENeut and the INeut; the scale bar is 1 µm.

Figure 7:
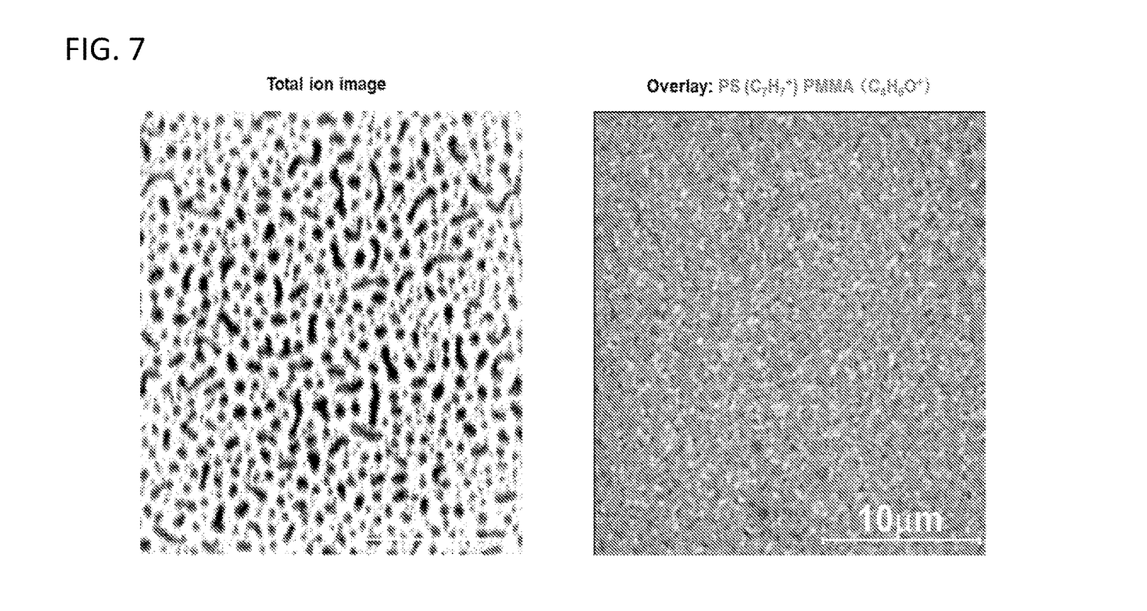
FIG. 7 shows ion images collected in the positive ion polarity from a copolymer blend of poly(styrene) (PS) and poly(methyl methacrylate) (PMMA); the image on the left is total ion, and the image on the right is a false color overlay of the PS monomer ion (green) and the PMMA monomer ion (red).

FIG. 7 shows ion images collected from a copolymer blend of poly(styrene) (PS) and poly(methyl methacrylate) (PMMA); the image on the left is Total Ion, and the image on the right is a false color overlay of the PS monomer ion ($C_7H_7^+$, m/z 91; green) and the PMMA monomer ion ($C_4H_5O^+$, m/z 69; red). The data was collected in the positive ion polarity using a 60 keV primary beam of $Bi_3^+$ ions at a DC current of $\approx$500 pA. The operating frequency was 8.3 kHz and the analytical field-of-view (FOV) was 25 µm. The high lateral resolution is a consequence of stable charge neutralization.

Thus, embodiments of METHODS AND SYSTEMS INCLUDING PULSED DUAL-BEAM CHARGE NEUTRALIZATION are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:

1. A surface imaging apparatus based on detection of secondary electrons or secondary ions, comprising:
   a spatially scanned and DC primary excitation source resulting in secondary electrons or secondary ions which are detected and provide the modulated signal for imaging of the sample; a source of a pulsed positive ion flood neutralizer beam;
   a source of an electron flood neutralizer beam; and
   independent columns for the positive ion flood neutralizer beam and the electron flood neutralizer beam,
   wherein the source of a pulsed positive ion flood neutralizer beam and the source of an electron flood neutralizer beam are independently controllable and provide dual polarity flood beams to effect neutralization of surface charge and surface potential variation,
   wherein the dual polarity flood beams comprise an electron beam and a positively charged ion beam and at least the positively charged ion beam is pulsed.

2. A surface imaging method based on detection of secondary electrons or secondary ions using the surface imaging apparatus of claim 1, the method comprising:
   using the spatially scanned and DC primary excitation source resulting in secondary electrons or secondary ions; detecting the secondary electrons or secondary ions;
   providing a modulated signal of the detected secondary electrons or secondary ions for imaging of a sample; and
   using the dual polarity flood beams to effect neutralization of surface charge and surface potential variation,
   wherein the dual polarity flood beams comprise an electron beam and a positively charged ion beam and at least the positively charged ion beam is pulsed.

3. The apparatus of claim 1, wherein the imaging is grey scale imaging.

4. The apparatus of claim 1, wherein the electron beam is also pulsed.

5. The apparatus of claim 1 further comprising a pulse counting or digital detection scheme for collection of the secondary electrons, or secondary ions wherein the pulse counting is gated during the time window in which either of the pulsed dual polarity flood beams are turned on.

6. The apparatus of claim 5, wherein spectral noise generated by the neutralization beams are substantially eliminated.

7. The apparatus of claim 1, wherein the surface imaging apparatus can be selected from any of SEM, FIB, PEEM, and LEEM.

8. A surface imaging apparatus based on detection of secondary electrons or secondary ions, comprising:
   a spatially scanned and pulsed primary excitation source resulting in secondary electrons or secondary ions which are detected and provide the modulated signal for imaging of the sample;
   a source of a pulsed positive ion flood neutralizer beam;
   a source of a pulsed electron flood neutralizer beam; and
   independent columns for the positive ion flood neutralizer beam and the electron flood neutralizer beam,
   wherein the source of a pulsed positive ion flood neutralizer beam and the source of an electron flood neutralizer beam are independently controllable and provide dual polarity flood beams to effect neutralization of surface charge and surface potential variation, wherein the pulsed charge neutralizing flood beams are interleaved with the pulsed primary excitation source, and
   wherein the dual polarity flood beams comprise an electron beam and a positively charged ion beam.

9. A surface imaging method based on detection of secondary electrons or secondary ions using the surface imaging apparatus of claim 8, the method comprising:
   using the spatially scanned and pulsed primary excitation source resulting in secondary electrons or secondary ions;
   detecting the secondary electrons or secondary ions;
   providing a modulated signal of the detected secondary electrons or secondary ions for imaging of a sample; and
   using the dual polarity flood beams to effect neutralization of surface charge and surface potential variation, wherein the dual polarity flood beams are interleaved with the pulsed primary excitation source, and
   wherein the dual polarity flood beams comprise a pulsed electron beam and the pulsed positively charged ion beam.

10. The apparatus of claim 8, wherein the imaging is grey scale imaging.

11. The apparatus of claim 8, wherein a surface imaging technique can be selected from any of SEM, FIB, PEEM, and LEEM.

12. A surface analysis apparatus based on energy analysis of secondary electrons or mass analysis of secondary ions, comprising:
   a DC primary excitation source resulting in characteristic secondary electrons to be energy analyzed or secondary ions to be mass analyzed;
   a source of a pulsed positive ion flood neutralizer beam;
   a source of an electron flood neutralizer beam; and
   independent columns for the positive ion flood neutralizer beam and the electron flood neutralizer beam,
   wherein the source of a pulsed positive ion flood neutralizer beam and the source of an electron flood neutralizer beam are independently controllable and provide dual polarity flood beams to effect neutralization of surface charge and surface potential variation, and
   wherein the dual polarity flood beams comprise an electron beam and a positively charged ion beam and at least the positively charged ion beam is pulsed.

13. A surface analysis method based on energy analysis of secondary electrons or mass analysis of secondary ions using the surface analysis apparatus of claim 12, the method, comprising:
   using the DC primary excitation source resulting in characteristic secondary electrons to be energy analyzed or secondary ions to be mass analyzed; and
   using the dual polarity flood beams to effect neutralization of surface charge and surface potential variation
   wherein the dual polarity flood beams comprise an electron beam and a positively charged ion beam and at least the positively charged ion beam is pulsed.

14. The apparatus of claim 12, wherein the electron beam is also pulsed.

15. The apparatus of claim 12, wherein the surface analysis apparatus utilizes a pulsed primary beam.

16. The apparatus of claim 12 further comprising a pulse counting or digital detection scheme for collection of energy selected secondary electrons or mass selected secondary ions, wherein the pulse counting is gated during a time window in which any pulsed dual polarity flood beams are turned on so as to eliminate any spectral noise generated by the neutralization beams.

17. The apparatus of claim 12, wherein the apparatus is a quadrupole mass spectrometer or a magnetic sector based DSIMS instrument.

18. The surface analysis method of claim 13, wherein the surface analysis method comprises XPS, AES, or DSIMS.

19. A surface analysis apparatus based on energy analysis of secondary electrons or mass analysis of secondary ions, comprising:
a pulsed primary excitation source resulting in characteristic secondary electrons to be energy analyzed or secondary ions to be mass analyzed;
a source of a pulsed positive ion flood neutralizer beam;
a source of a pulsed electron flood neutralizer beam; and
independent columns for the positive ion flood neutralizer beam and the electron flood neutralizer beam,
wherein the source of a pulsed positive ion flood neutralizer beam and the source of an electron flood neutralizer beam are independently controllable and provide dual polarity flood beams to effect neutralization of surface charge and surface potential variation, wherein the dual polarity flood beams are interleaved with the pulsed primary excitation source, and
wherein the dual polarity flood beams comprise a pulsed electron beam and a pulsed positively charged ion beam.

20. A surface analysis method based on energy analysis of secondary electrons or mass analysis of secondary ions using the surface analysis apparatus of claim 19, the method comprising:
using the pulsed primary excitation source resulting in characteristic secondary electrons to be energy analyzed or secondary ions to be mass analyzed; and
using the dual polarity flood beams to effect neutralization of surface charge and surface potential variation, wherein the dual polarity flood beams are interleaved with the pulsed primary excitation source, and
wherein the dual polarity flood beams comprise a pulsed electron beam and a pulsed positively charged ion beam.

21. The surface analysis method of claim 20, wherein the surface analysis method comprises XPS, AES, or DSIMS.

22. An ion spectroscopic apparatus comprising:
a pulsed primary excitation source which generates secondary ions to be mass analyzed, a source of a pulsed positive ion flood neutralizer beam;
a source of a pulsed electron flood neutralizer beam; and
independent columns for the positive ion flood neutralizer beam and the electron flood neutralizer beam,
wherein the source of a pulsed positive ion flood neutralizer beam and the source of an electron flood neutralizer beam are independently controllable and provide dual polarity flood beams to effect neutralization of surface charge and surface potential variation, wherein the pulsed charge neutralizing flood beams are interleaved with the pulsed primary excitation source, and
wherein the dual polarity flood beams comprise a pulsed electron beam and a pulsed positively charged ion beam.

23. An ion spectroscopic method using the ion spectroscopic apparatus of claim 22, the method comprising:
using the pulsed primary excitation source to generate secondary ions to be mass analyzed,
and
using the dual polarity flood beams to effect neutralization of surface charge and surface potential variation,
wherein the pulsed charge neutralizing flood beams are interleaved with the pulsed primary excitation source, and
wherein the dual polarity flood beams comprise the pulsed electron beam and the pulsed positively charged ion beam.

24. The apparatus of claim 22, wherein the apparatus is configured for an analysis technique selected from MALDI, quadrupole, or magnetic-sector DSIMS that includes a pulsed primary beam.

25. The apparatus of claim 22 comprising a TOF-SIMS apparatus.

26. The method of claim 23, wherein the pulsed primary excitation source is the pulsed primary excitation source of a TOF-SIMS instrument.

* * * * *